United States Patent
Lee et al.

(10) Patent No.: US 9,202,780 B2
(45) Date of Patent: Dec. 1, 2015

(54) THREE DIMENSIONAL SEMICONDUCTOR DEVICE INCLUDING PADS

(71) Applicant: SK hynix Inc., Icheon-si (KR)

(72) Inventors: Ki Hong Lee, Suwon-si (KR); Seung Ho Pyi, Seongnam-si (KR); Seok Min Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/524,647

(22) Filed: Oct. 27, 2014

(65) Prior Publication Data

US 2015/0064900 A1 Mar. 5, 2015

Related U.S. Application Data

(62) Division of application No. 13/845,446, filed on Mar. 18, 2013, now Pat. No. 8,907,474.

(30) Foreign Application Priority Data

Jan. 7, 2013 (KR) .......................... 10-2013-0001656

(51) Int. Cl.
| | |
|---|---|
| H01L 21/4763 | (2006.01) |
| H01L 23/498 | (2006.01) |
| H01L 27/24 | (2006.01) |
| H01L 21/02 | (2006.01) |
| H01L 21/311 | (2006.01) |
| H01L 21/3115 | (2006.01) |
| H01L 21/3205 | (2006.01) |
| H01L 21/768 | (2006.01) |
| H01L 27/06 | (2006.01) |
| H01L 27/115 | (2006.01) |

(52) U.S. Cl.
CPC ........ *H01L 23/498* (2013.01); *H01L 21/02244* (2013.01); *H01L 21/31111* (2013.01); *H01L 21/31155* (2013.01); *H01L 21/32051* (2013.01); *H01L 21/7685* (2013.01); *H01L 27/0688* (2013.01); *H01L 27/11575* (2013.01); *H01L 27/11582* (2013.01); *H01L 27/2481* (2013.01); *H01L 27/11548* (2013.01); *H01L 27/11556* (2013.01); *H01L 2924/0002* (2013.01)

(58) Field of Classification Search
CPC ..................... H01L 21/7685; H01L 21/02244; H01L 21/31111; H01L 21/31155; H01L 21/32051; H01L 23/498; H01L 27/0688; H01L 27/11575; H01L 27/11582
USPC ........................................................ 438/620
See application file for complete search history.

(56) References Cited

U.S. PATENT DOCUMENTS

| | | | | |
|---|---|---|---|---|
| 2011/0284943 A1* | 11/2011 | Hwang | ............... | H01L 27/0207 257/314 |
| 2012/0108048 A1* | 5/2012 | Lim | .................. | H01L 27/11529 438/586 |
| 2014/0061750 A1* | 3/2014 | Kwon | ................. | H01L 27/1052 257/314 |
| 2014/0061776 A1* | 3/2014 | Kwon | ................. | H01L 21/8239 257/329 |

\* cited by examiner

*Primary Examiner* — Minh-Loan Tran
*Assistant Examiner* — Farid Khan
(74) *Attorney, Agent, or Firm* — William Park & Associates Ltd.

(57) ABSTRACT

A semiconductor device includes a substrate in which a cell region and a contact region are defined, a pad structure including a plurality of first conductive layers and a plurality of first insulating layers formed alternately with each other in the contact region of the substrate, wherein an end of the pad structure is patterned stepwise, portions of the first conductive layers exposed at the end of the pad structure are defined as a plurality of pad portions, and the plurality of pad portions have a greater thickness than unexposed portions of the plurality of first conductive layers.

8 Claims, 17 Drawing Sheets

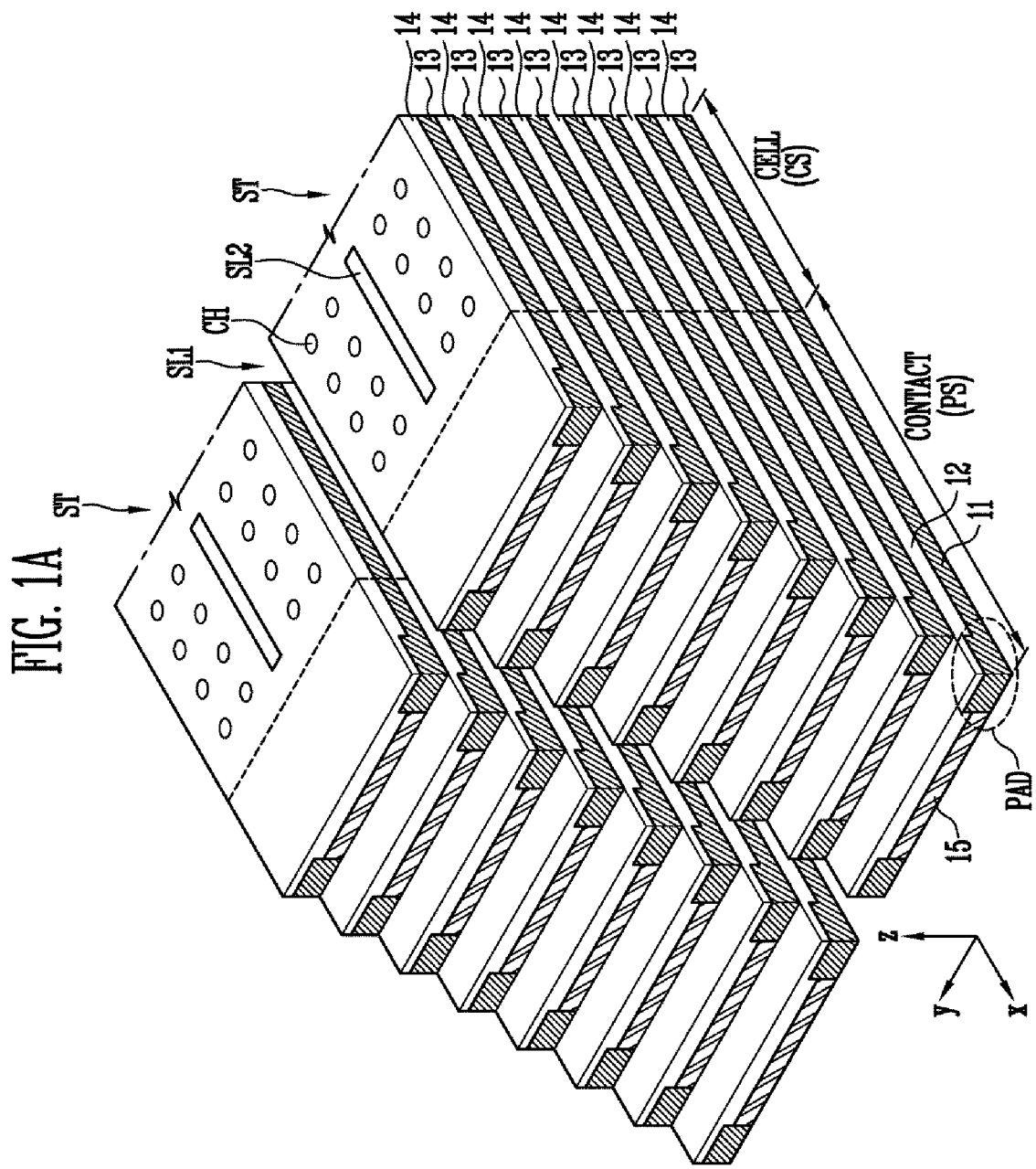

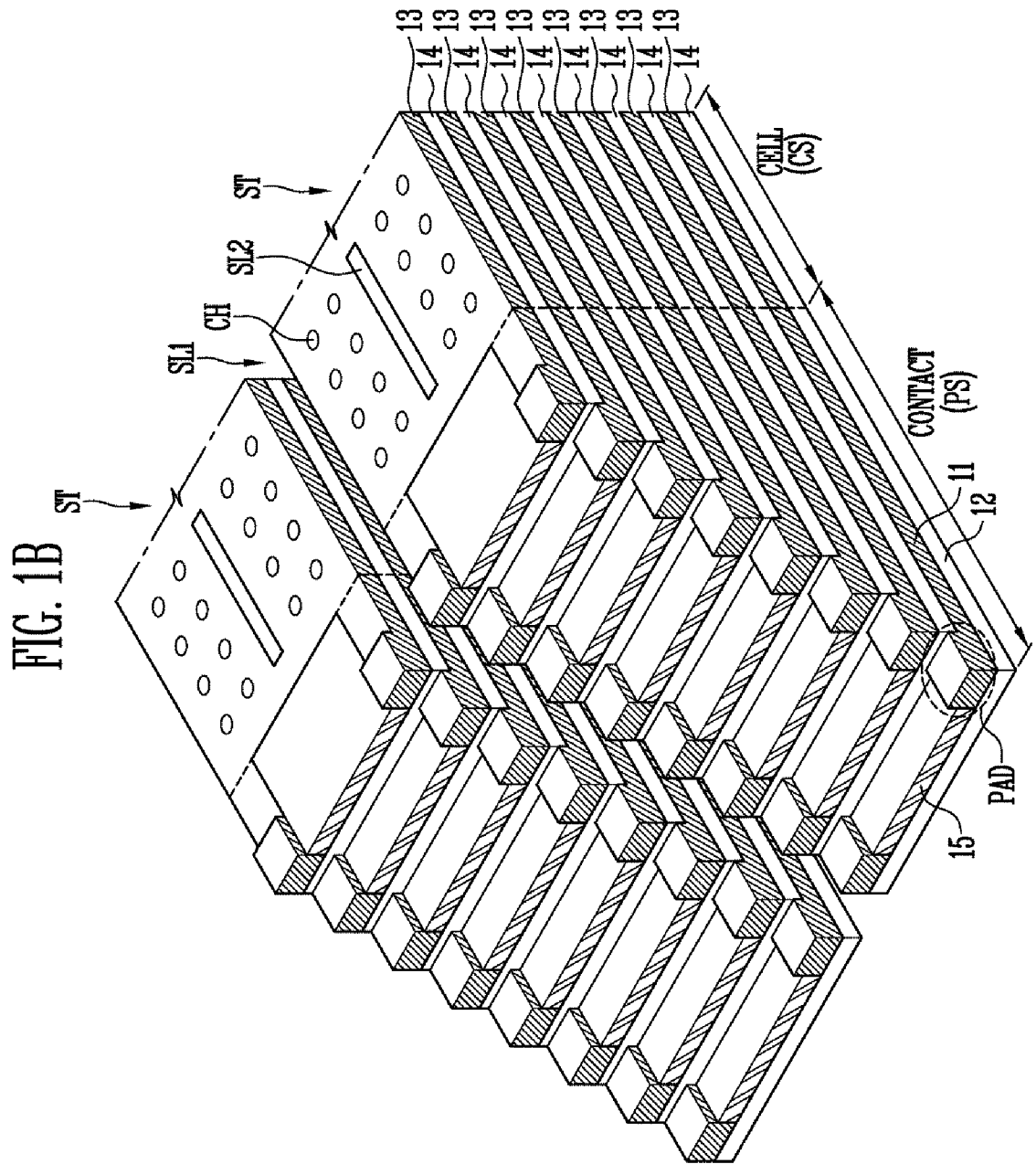

THREE DIMENSIONAL SEMICONDUCTOR DEVICE INCLUDING PADS

CROSS-REFERENCE TO RELATED APPLICATION

The present application claims priority to Korean patent application number 10-2013-0001656 filed on Jan. 7, 2013, in the Korean Intellectual Property Office, the entire disclosure of which is incorporated by reference herein.

BACKGROUND

1. Technical Field

Various embodiments relate generally to a semiconductor device and a method of manufacturing the same and, more particularly, to a three-dimensional semiconductor device and a method of manufacturing the same.

2. Related Art

A non-volatile memory retains data stored therein even when not powered. Two-dimensional memory devices in which memory cells are fabricated in a single layer over a silicon substrate have reached physical limits and may no longer have increased degrees of integration. Accordingly, three-dimensional (3D) non-volatile memory devices in which memory cells are stacked in a vertical direction over a silicon substrate have been proposed.

A 3D non-volatile memory device includes interlayer insulating layers and word lines stacked alternately with each other and channel layers penetrating therethrough. Memory cells are stacked along the channel layers. In order to selectively drive particular memory cells, a pad portion is to be formed on each word line, and a contact plug is to be coupled to the pad portion.

It is difficult to form pad portions on word lines stacked on top of one another and form contact plugs so that the contact plugs are coupled to the pad portions. In addition, a punch phenomenon may occur in which a contact plug passes through a pad portion, or the contact plug and the pad portion are not coupled to each other since a pad portion is not exposed along a bottom surface of a contact hole.

SUMMARY

Various embodiments relate to a semiconductor device capable of easily forming a pad portion and a method of manufacturing the same.

A semiconductor device according to an embodiment of the present invention includes a substrate in which a cell region and a contact region are defined, a pad structure including a plurality of first conductive layers and a plurality of first insulating layers formed alternately with each other in the contact region of the substrate, wherein an end of the pad structure is patterned stepwise, portions of the first conductive layers exposed at the end of the pad structure are defined as a plurality of pad portions, and the plurality of pad portions have a greater thickness than unexposed portions of the plurality of first conductive layers.

A semiconductor device according to an embodiment of the present invention includes a substrate, a plurality of stacked structures including a plurality of conductive layers and a plurality of insulating layers formed alternately with each other on the substrate, wherein each end of the plurality of stacked structures is patterned stepwise, and at least one slit separating the plurality of stacked structures from each other, wherein portions of the plurality of conductive layers exposed at each end of the plurality of stacked structures are defined as a plurality of pad portions, and the plurality of pad portions have a greater thickness than unexposed portions of the plurality of conductive layers.

BRIEF DESCRIPTION OF THE DRAWINGS

FIG. 1A is a perspective view illustrating the structure of a semiconductor device according to an embodiment of the present invention;

FIG. 1B is a perspective view illustrating the structure of a semiconductor device according to another embodiment of the present invention;

DETAILED DESCRIPTION

Figure 2A:
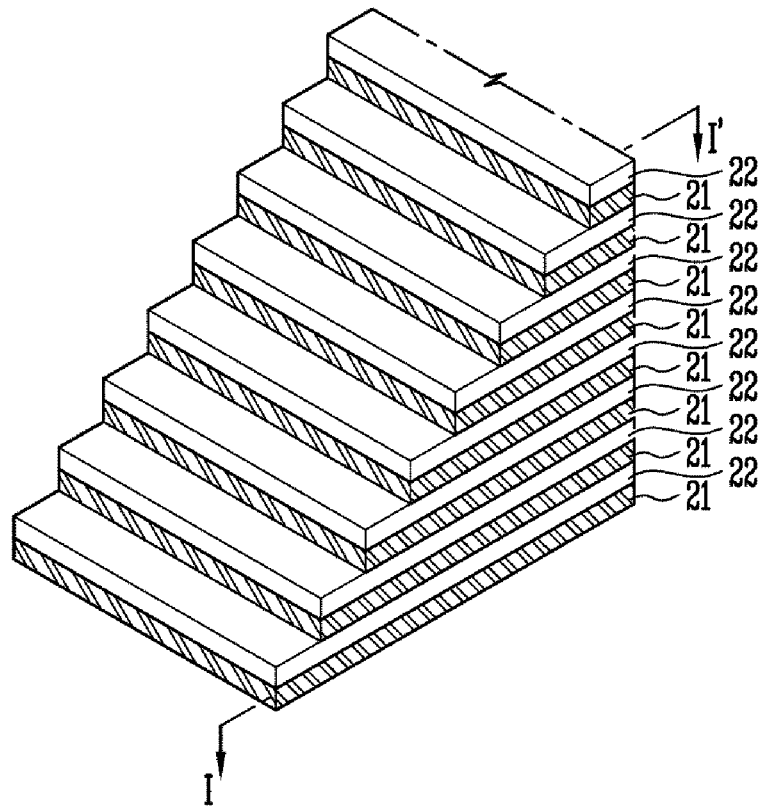
FIGS. 2A to 7B are views illustrating a method of manufacturing a semiconductor device according to an embodiment of the present invention.

Hereinafter, various embodiments of the present invention will be described with reference to the accompanying drawings. In the drawings, a thickness and a distance of components may be exaggerated compared to an actual physical thickness and interval for convenience of illustration. In the following description, detailed explanations of known related functions and constitutions may be omitted to avoid unnecessarily information obscuring the subject manner of the present invention. Like reference numerals refer to like elements throughout the specification and drawings.

As illustrating in FIG. 1A, a semiconductor device may include a substrate (not illustrated), stacked structures ST, and at least one first slit SL1. A cell region CELL and a contact region CONTACT may be defined in the substrate. The stacked structures ST may include conductive layers 11 and 13 and insulating layers 12 and 14 that are formed alternately with each other on the substrate. The first slit SL1 may separate neighboring stacked structures ST from each other.

An end of the stacked structure ST may be patterned stepwise. Each step of the stacked structure ST that is patterned stepwise may include at least one conductive layer 11 or 13 and at least one insulating layer 12 or 14. As illustrated in FIG. 1A, the insulating layer 12 or 14 may be located on a top surface of each step. Alternatively, as illustrated in FIG. 1B, the conductive layer 11 or 13 may be located on the top surface of each step.

The stacked structure ST may include a pad structure PS located in the contact region CONTACT and a cell structure CS located in the cell region CELL. The pad structure PS and the cell structure CS may be coupled to each other. For example, the pad structure PS may be located at either or both sides of the cell structure CS.

The pad structure PS may include first conductive layers 11 and first insulating layers 12 that are alternately formed in the contact region CONTACT of the substrate. An end of the pad structure PS may be patterned stepwise. Portions of the first conductive layers 11 that are exposed along the stepped end of the pad structure PS may be defined as pad portions PAD. The pad portions PAD may have a greater thickness than unexposed portions of the first conductive layer 11.

In addition, the pad structure PS may further include sacrificial layers 15. The sacrificial layers 15 may be coupled to the first conductive layers 11. For example, the first conductive layers 11 may be stacked on side walls along the z-axis of the pad structure PS exposed through the first slit SL1, i.e., in side regions thereof. The sacrificial layers 15 may be stacked along the z-axis in a central region of the pad structure PS. The pad portions PAD may have a greater thickness than the sacrificial layers 15.

The cell structure CS may include second conductive layers 13 and second insulating layers 14 that are formed alternately with each other in the cell region CELL of the substrate. The first conductive layers 11 and the second conductive layers 13 that are formed on the same level may be coupled to each other, and the first insulating layers 12 and the second insulating layers 14 that are formed on the same level may be coupled to each other. For example, the first conductive layer 11 and the second conductive layer 13 that are formed on the same level may be formed in a single layer, and the first insulating layer 12 and the second insulating layer 14 that are formed on the same level may be formed in a single layer.

The semiconductor device may further include channel layers CH that penetrate the cell structure CS and at least one second slit SL2 that penetrates the cell structure CS.

According to the above-described structure of the semiconductor device, the pad portion PAD may have a greater thickness than other unexposed portions of the first conductive layer 11. In addition, the pad portion PAD may have a greater thickness than the second conductive layer 13 and the sacrificial layer 15. Therefore, the thickness of the pad portion PAD may be selectively increased without increasing the height of the stacked structure ST.

FIGS. 2A to 7A are perspective views, and FIGS. 2B to 7B are cross-sectional views taken along lines I-I' of FIGS. 2A to 7A. For illustration purposes, part of the stacked structure ST, especially the pad structure PS, is depicted.

Figure 2B:
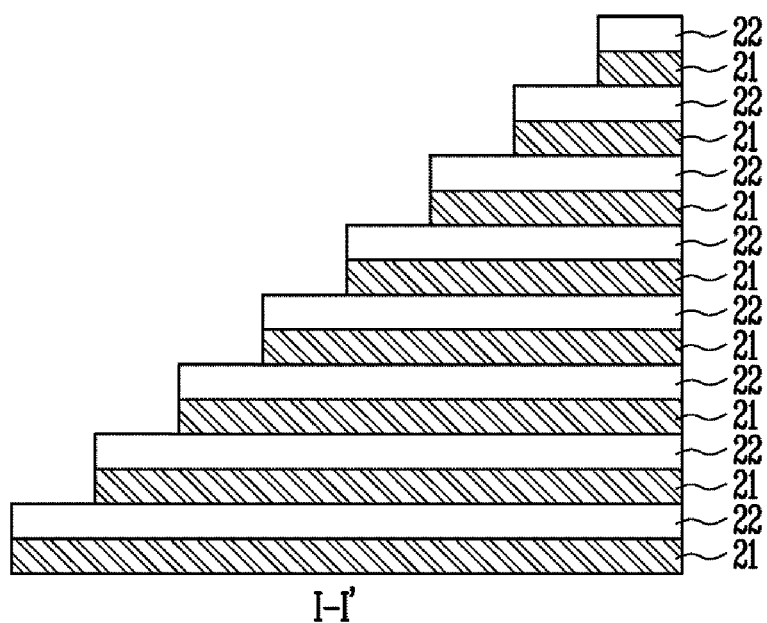

As illustrated in FIGS. 2A and 2B, a plurality of first material layers 21 and a plurality of second material layers 22 may be formed alternately with each other. The first material layers 21 may be provided to form conductive layers, and the second material layers 22 may be provided to form insulating layers.

The first material layers 21 may be formed of materials having a high etch selectivity with respect to the second material layers 22. For example, the first material layers 21 may include a conductive layer such as a polysilicon layer, and the second material layers 22 may include an insulating layer such as an oxide layer. In another example, the first material layers 21 may include a sacrificial layer such as a nitride layer, and the second material layers 22 may include an insulating layer such as an oxide layer.

In an embodiment of the present invention, a description will be provided for an example in which the first material layer 21 includes a sacrificial layer and the second material layer 22 includes an insulating layer.

Subsequently, ends of an intermediate resultant structure including the first and second material layers 21 and 22 may be patterned stepwise. Each step of the intermediate resultant structure that is patterned stepwise may include a single first material layer 21 and a single second material layer 22 formed on the first material layer 21.

Though not shown in FIGS. 2A and 2B, processes of forming memory cells may be performed before or after stepwise-patterning the first and second material layers 21 and 22. For example, a hole may be formed through the first and second material layers 21 and 22, and a memory layer and the channel layer CH may be formed in the hole. The memory layer may include at least one of a charge blocking layer, a data storage layer, or a tunnel insulating layer. The data storage layer may include a floating gate, such as a polysilicon layer, which can store charge, a charge trap layer, such as a nitride layer, which can trap charge, and nanodots. Before the memory layer is formed, a sacrificial layer may be formed in the hole. In addition, the channel layer CH may have various shapes such as a straight shape, a U-shape and a W-shape. The channel layer CH may be formed in a tubular shape having an open central portion, in a pillar shape having a central portion completely filled, or a combination thereof. In another example, a gate insulating layer, the channel layer CH, and a phase-change material layer may be sequentially formed in the hole. The phase-change material layer may be formed in a tubular shape having an open central region, in a pillar shape having a central portion completely filled, or a combination thereof.

Figure 3A:
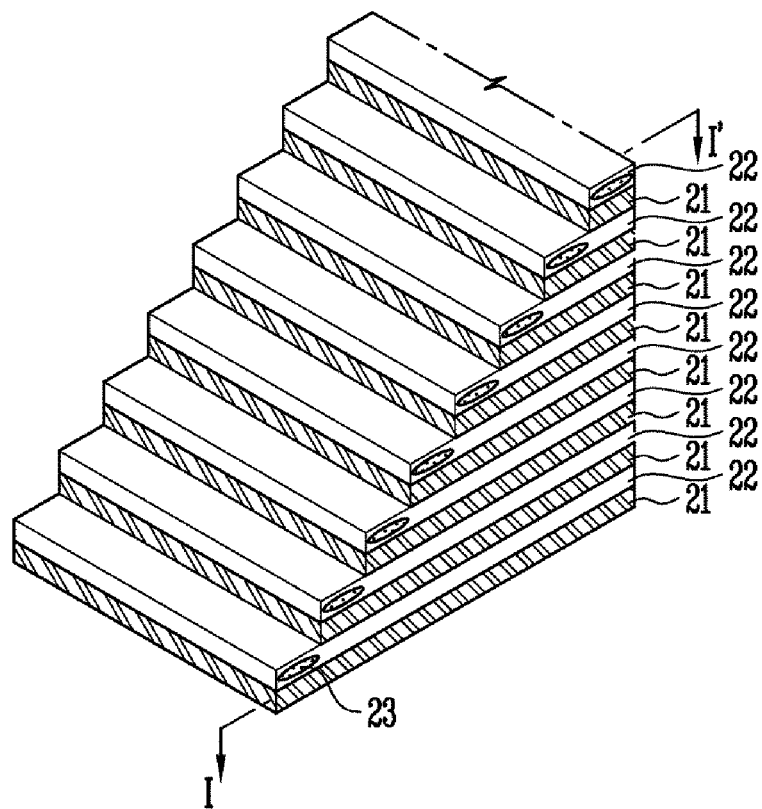
Figure 3B:
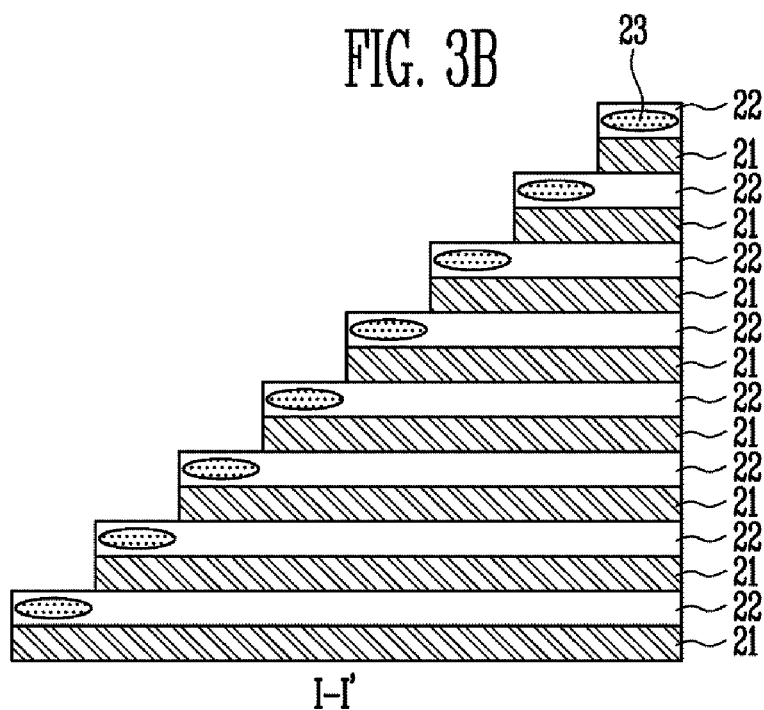

As illustrated in FIGS. 3A and 3B, impurities may be implanted into the intermediate resultant structure that is patterned stepwise, so that impurity regions 23 may be formed in the second material layers 22. For example, impurities such as N type impurities, P type impurities, argon (Ar), or helium (He) may be implanted by using an ion implantation process. In addition, process conditions may be controlled so that the projected ion range (Rp) of the ion implantation process may be located in the second material layers 22.

During an impurity ion implantation process, a mask pattern may be used. For example, a mask pattern may be formed over the first and second material layers 21 and 22 so that the mask pattern may expose side regions of the contact region CONTACT and cover a cell region and a central region of the contact region CONTACT. Subsequently, an ion implantation process may be performed using the mask pattern as a barrier.

Figure 4A:
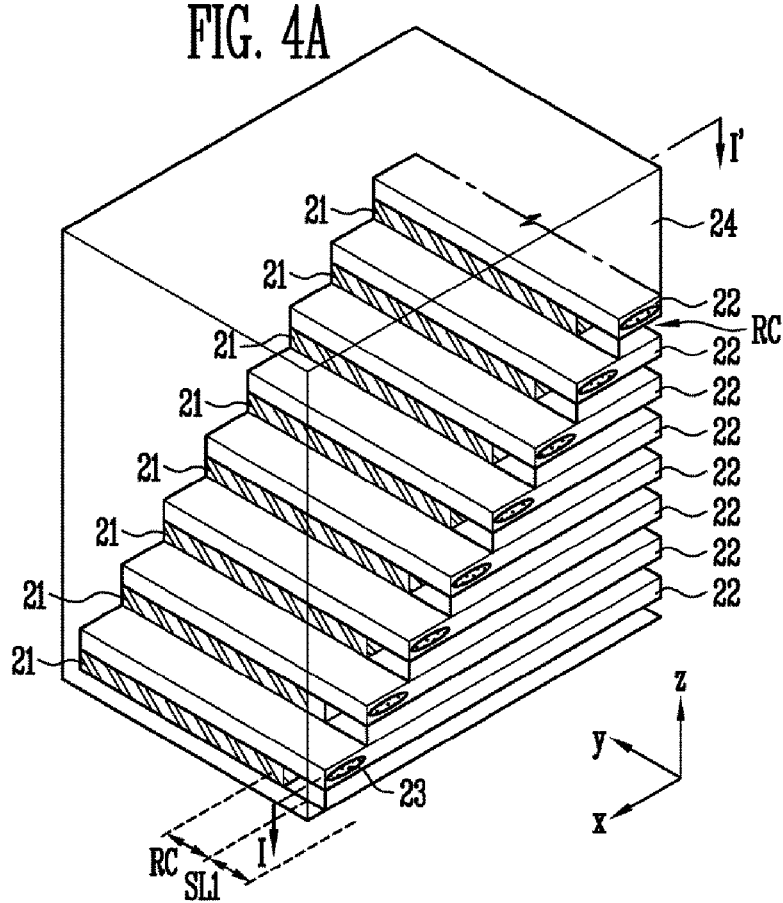
Figure 4B:
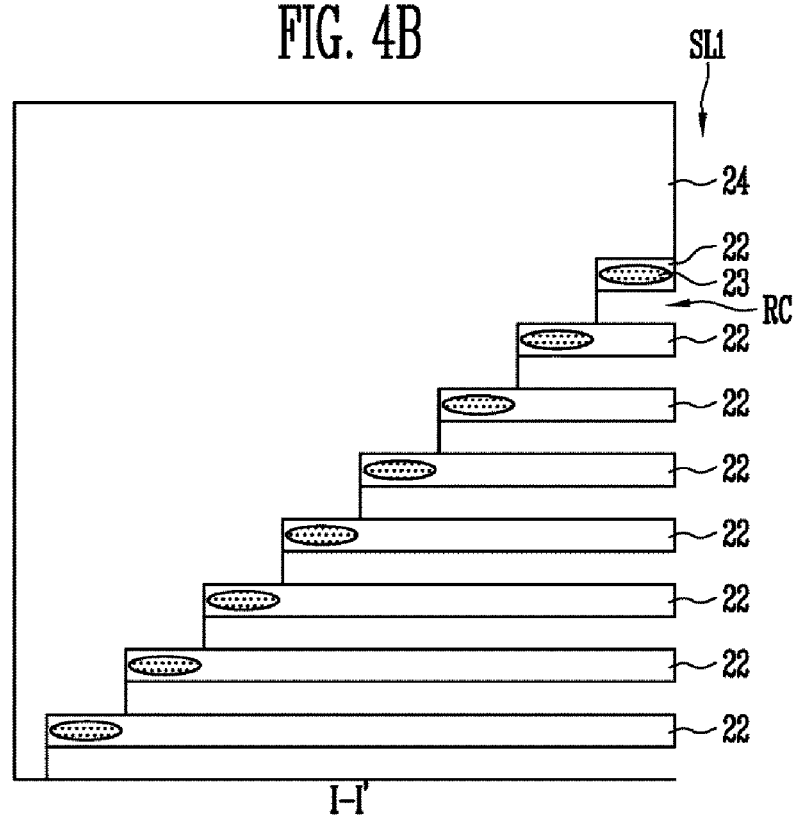

As illustrated in FIGS. 4A and 4B, the first material layers 21 may be removed to form recessed regions RC. For example, after an interlayer insulating layer 24 is formed on the first and second material layers 21 and 22, at least one first slit SL1 may be formed through the interlayer insulating layer 24, the first material layers 21, and the second material layers 22. As a result, the stacked structures ST may be separated from each other by the first slit SL1. Subsequently, the first material layers 21 exposed through the first slit SL1 may be removed by being etched from side walls of the stacked structure ST exposed through the first slit SL1. Therefore, the first material layers 21 may be removed along the y-axis from side regions of each stacked structure ST, while the first material layers 21 in a central region thereof may remain.

A second slit SL2 (see FIGS. 1A and 1B) located in the cell region CELL may also be formed when the first slit SL1 is formed. If the second slit SL2 is formed in the cell region CELL, the first material layers 21 exposed through the first and second slits SL1 and SL2 may be removed. Therefore, the first material layers 21 may be completely removed from the cell region CELL.

Figure 5A:
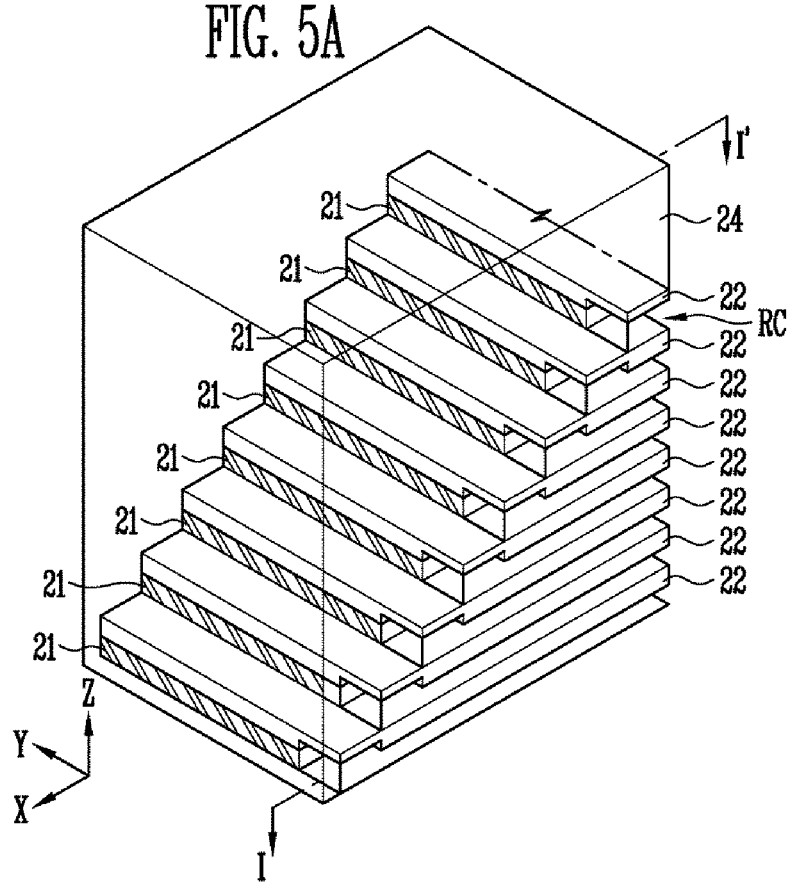
Figure 5B:
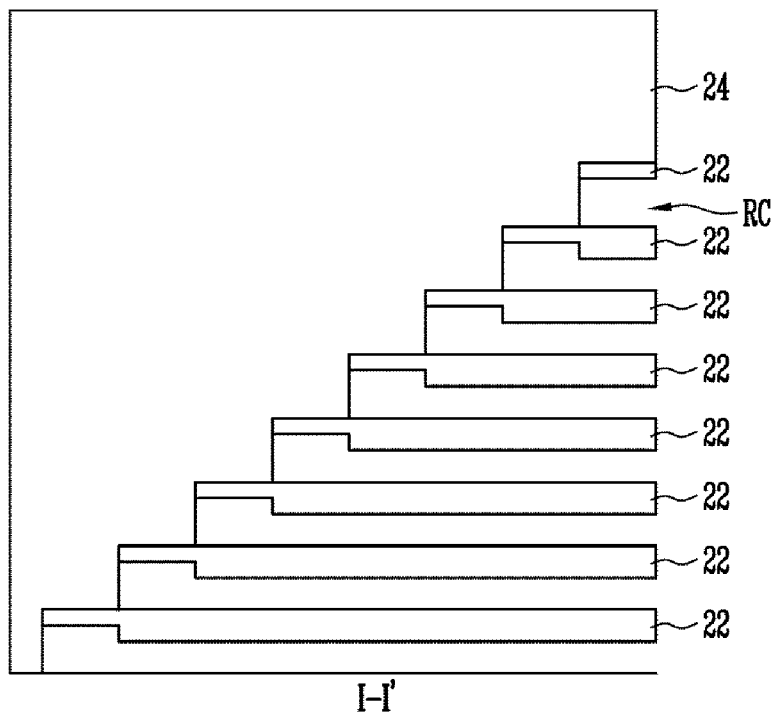

As illustrated in FIGS. 5A and 5B, the thickness of ends of the recessed regions RC may be increased. For example, the second material layers 22 exposed by the recessed regions RC may be etched to a predetermined thickness by using a wet etch process. Since an etch rate of the impurity region 23 is higher than that of a region implanted with no impurities, an etch amount of the impurity region 23 may be greater than that of a non-implanted region. Therefore, the ends of the recessed regions RC may be extended.

As described above, in an example where a sacrificial layer is formed in a hole, the sacrificial layer exposed through the recessed regions RC may also be etched during an etch process performed to extend the ends of the recessed regions RC. In this example, a memory layer may be exposed along the recessed regions RC formed in the cell region CELL.

Figure 6A:
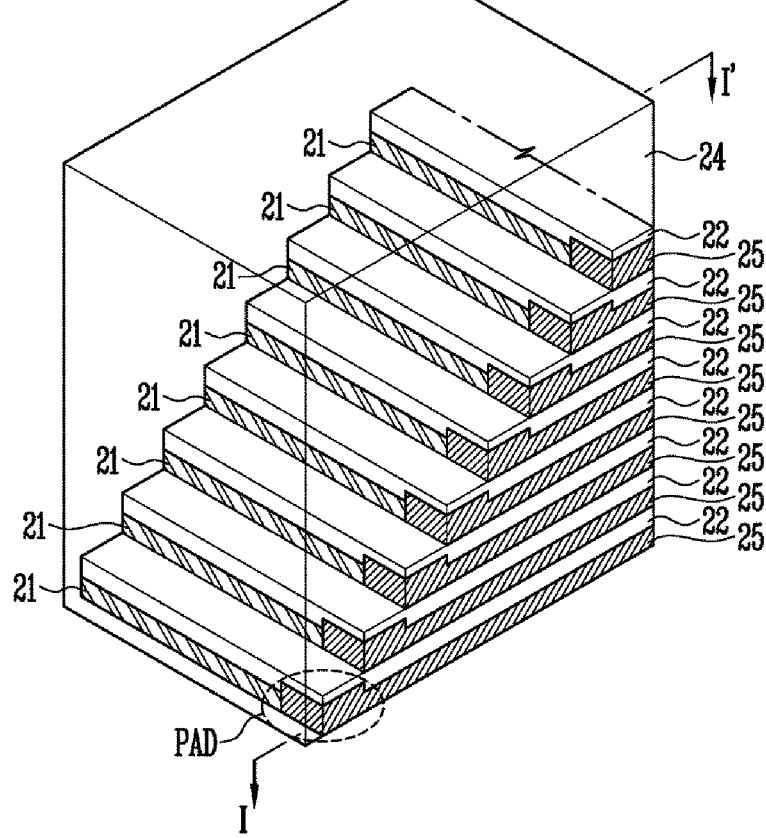
Figure 6B:
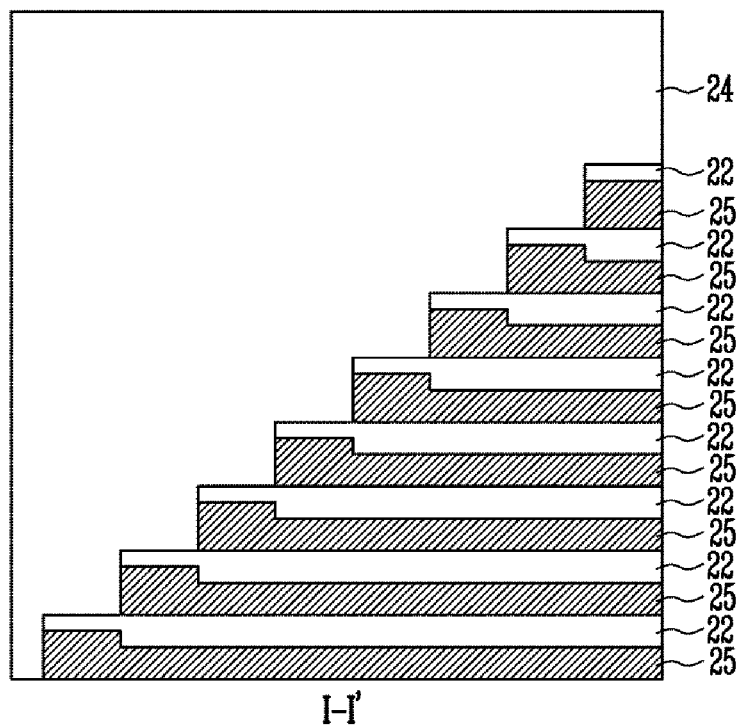

As illustrated in FIGS. 6A and 6B, memory layers, followed by conductive layers 25, may be formed in the recessed regions RC. Each of the memory layers may include at least one of a charge blocking layer, a data storage layer, and a tunnel insulating layer.

As a result, the conductive layers 25 may be formed in which the pad portions PAD exposed at the end of the stacked structure ST may have a greater thickness than unexposed portions of the conductive layers 25.

Figure 7A:
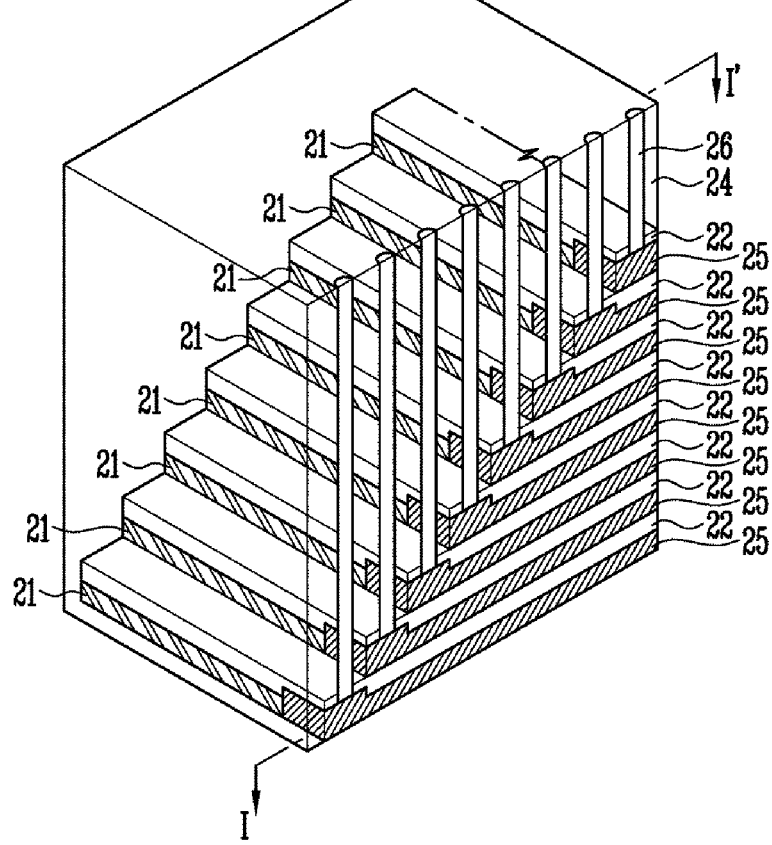
Figure 7B:
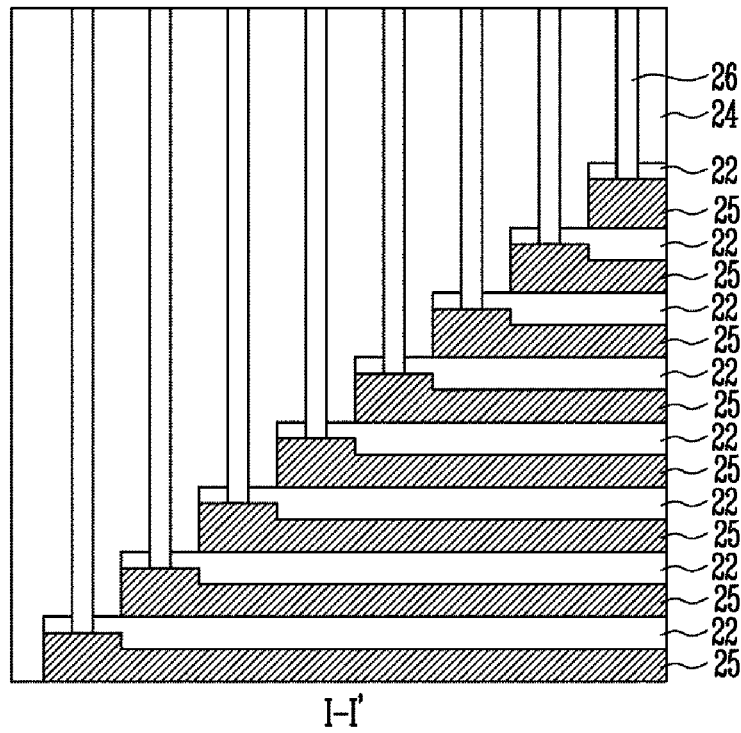

As illustrated in FIGS. 7A and 7B, contact holes may be formed through the interlayer insulating layer 24 so that the pad portions PAD may be exposed through contact holes, and conductive layers may be formed in the contact holes. As a result, contact plugs 26 may be formed such that each of the contact plugs 26 may be coupled to each of the pad portions PAD.

The contact holes may be formed at different depths depending on heights of the pad portions PAD. Conventionally, a punch phenomenon may occur due to over-etching of upper pad portions PAD, or a not-open phenomenon may occur in which lower pad portions PAD may not be exposed along bottom surfaces of the contact holes. However, according to an embodiment of the present invention, since the thickness of the pad portion PAD may be selectively increased to ensure an etch margin, the above-described phenomena may be prevented.

Although a description has been made to an example in which the contact plugs 26 are arranged in a line, the contact plugs 26 may be arranged in other ways, such as in a staggered pattern.

Various changes may be made to the above-described manufacturing processes, depending on types of the first and second material layers 21 and 22.

For example, the first material layers 21 may include conductive layers, and the second material layers 22 may include interlayer insulating layers. According to this example, after the first slit SL1 is formed, the second material layers 22 may be etched by using a wet etch process. Since the impurity region 23 is etched at a higher rate than a region implanted with no impurities, the second material layers 22 formed at the upper parts of the pad portions PAD may be etched to form recessed regions. Subsequently, metal layers may be formed in the recessed regions and in the first slit SL1, and the first material layers 21 and the metal layers may react with each other to thereby silicide the first material layers 21. Since the pad portion PAD of the first layer 21 may contact and react with a greater portion of the metal layer through the recessed region, a silicide layer having a greater thickness than other regions may be formed. Thus, processes of forming the recessed regions RC by removing the first material layers 21 may be skipped.

Hereinafter, a description of the contents of additional processes in the same manner as the above-described manufacturing processes is omitted.

Figure 8A:
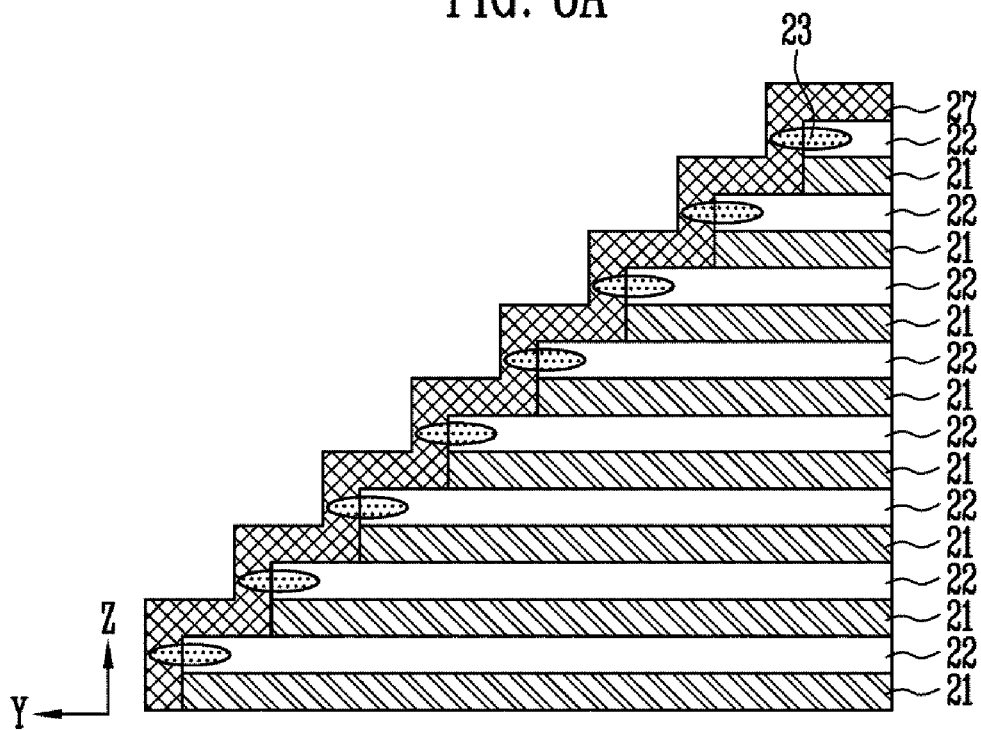
FIGS. 8A to 8B are views illustrating additional processes of the method of manufacturing a semiconductor device according to an embodiment of the present invention.
Figure 8B:
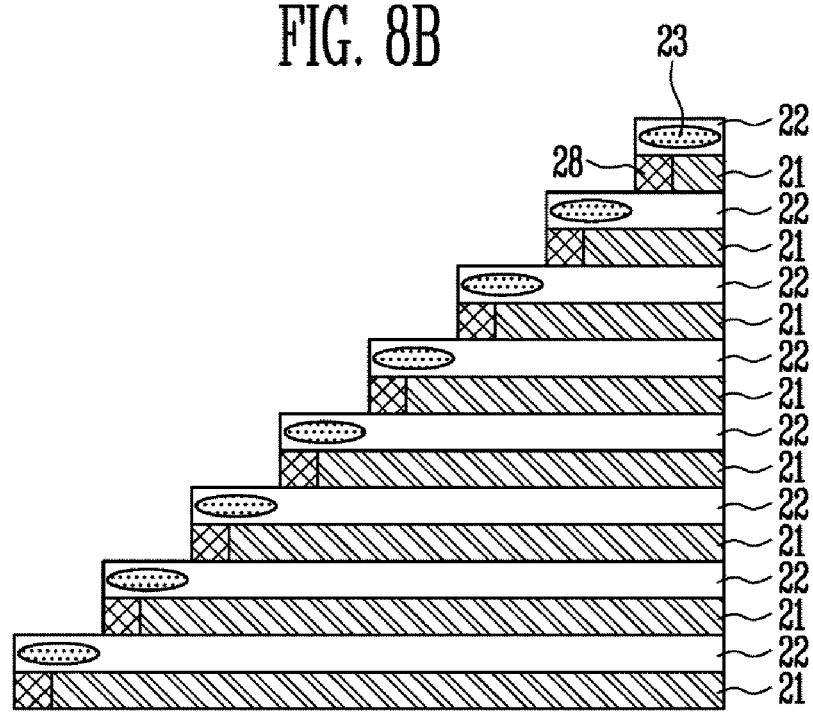

As illustrated in FIG. 8A, before an impurity implantation process is performed, a barrier layer 27 may be formed on the entire surface of the intermediate resultant structure that is patterned stepwise. Alternatively, as illustrated in FIG. 8B, before an impurity implantation process is performed, side walls of the first material layers 21 exposed at respective steps may be oxidized to thereby form a plurality of barrier layers 28.

The barrier layers 27 and 28 may be formed in order to ensure an etch margin when the ends of the recessed regions RC are extended. Particularly, the barrier layers 27 and 28 may be formed to ensure the distance between stacked conductive layers (pad portions). As described above with reference to FIG. 5A, processes of increasing the thickness of the ends of the recessed region RC may be performed to extend the ends of the recessed regions RC in a Z direction and thereby increase the thickness of the pad portions PAD. However, the recessed regions RC may also be extended in the X direction during an etch process. Conventionally, the distance between the stacked conductive layers (pad portions) may decrease, and therefore a breakdown voltage of the conductive layers 25 may be deteriorated. However, according to an embodiment of the present invention, since an etch margin is ensured by the barrier layers 27 and 28, a sufficient distance may be ensured between the stacked conductive layers (pad portions) to prevent any deterioration.

When the barrier layers 27 and 28 are formed, the interlayer insulating layer 24 (not shown) may be formed over the barrier layers 27 and 28. In addition, each of the barrier layers 27 and 28 may be etched to a predetermined thickness during the etch process for extending the ends of the recessed regions RC, but other portions which are not etched may remain. For example, the barrier layer 27 formed on the entire surface of the stacked structure ST or the barrier layer 28 formed on the side wall of the pad portion PAD may remain.

FIGS. 9A to 11A are perspective views illustrating a method of manufacturing a semiconductor device according to another embodiment of the present invention, and FIGS. 9B to 11B are cross-sectional views taken along lines I-I'. For illustration purposes, part of the stacked structure ST, especially part of the pad structure, is depicted. Hereinafter, a description of common contents with earlier described embodiments is omitted.

Figure 9A:
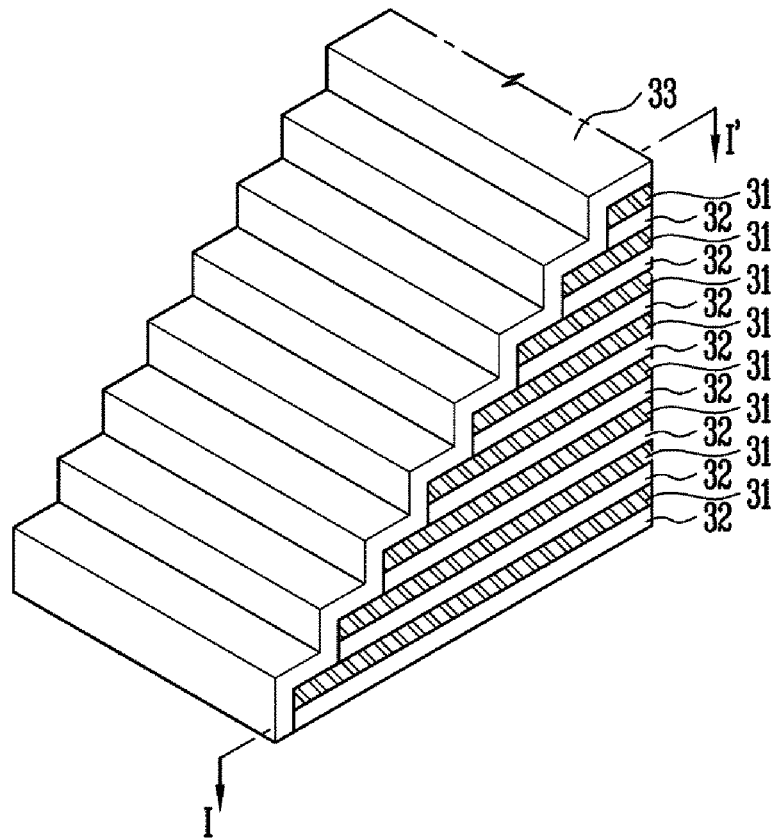
FIGS. 9A to 11B are views illustrating additional processes of the method of manufacturing a semiconductor device according to another embodiment of the present invention.
Figure 9B:
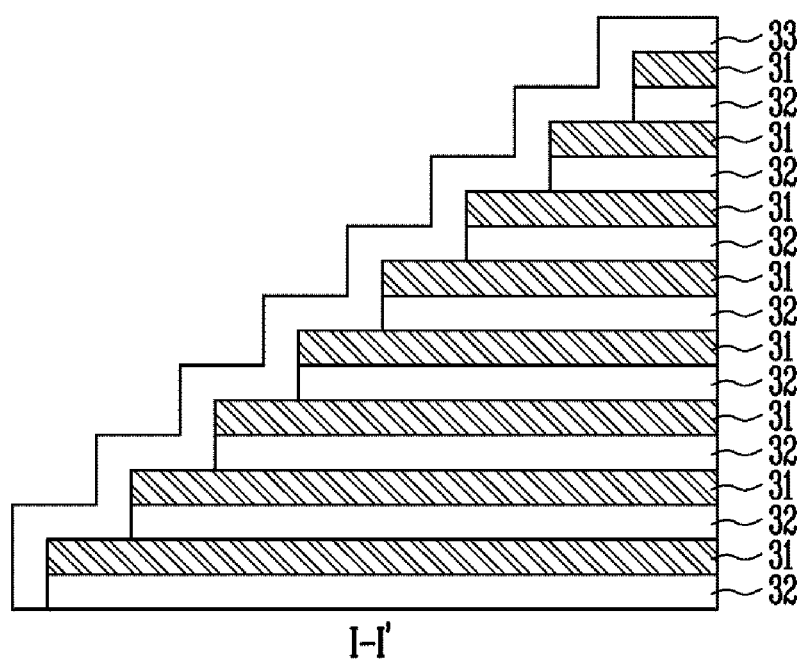

As illustrated in FIGS. 9A and 9B, a plurality of first material layers 31 and a plurality of second material layers 32 may be formed alternately with each other. A description will be made to an example in which the first material layer 31 includes a sacrificial layer, and the second material layer 32 includes an insulating layer.

Ends of an intermediate resultant structure including the first and second material layers 31 and 32 may be patterned stepwise. Each step of the intermediate resultant structure that is patterned stepwise may include a single first material layer 31 and a single second material layer 32 formed under the first material layer 31.

Subsequently, a buffer layer 33 may be formed on an entire surface of the intermediate resultant structure that is patterned stepwise. The buffer layer 33 may include materials having a high etch selectivity with respect to the first and second material layers 31 and 32. For example, the buffer layer 33 may include materials having a high etch selectivity with respect to the first material layers 31 and a higher etch rate than the second material layers 32.

In addition, the buffer layer 33 may be formed with a sufficient thickness since the buffer layer 33 may be etched to a predetermined thickness during subsequent etch processes for extending the ends of the recessed regions RC.

Figure 10A:
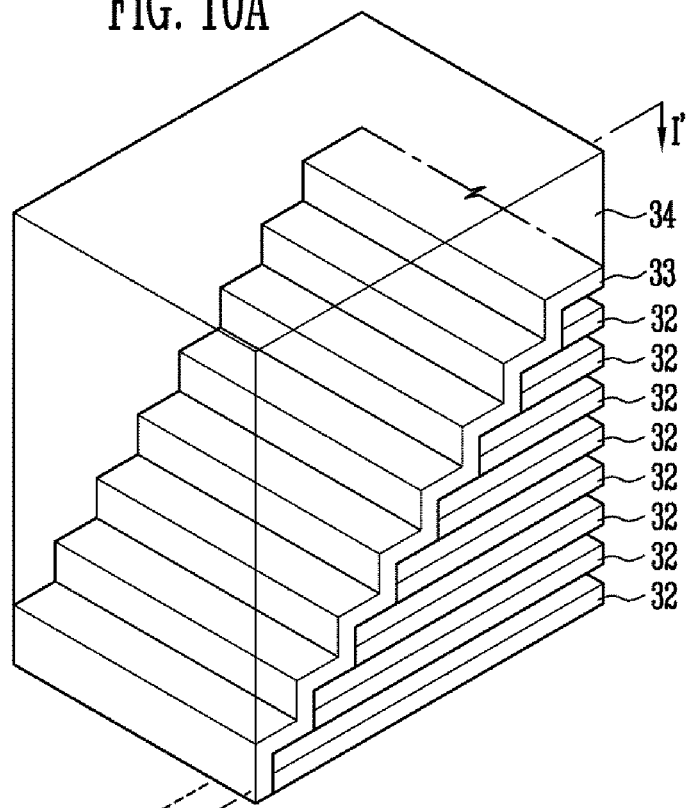
Figure 10B:
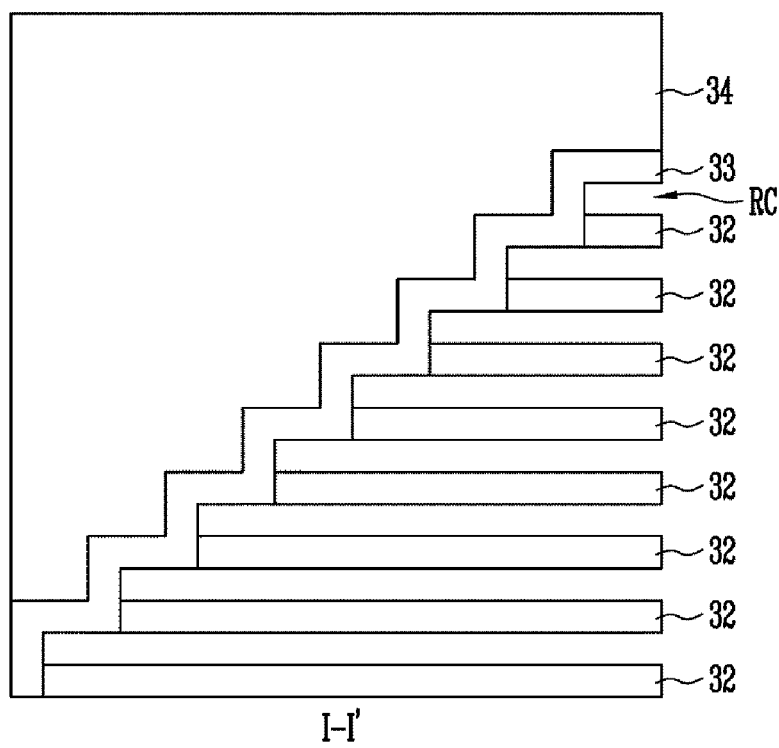

As illustrated in FIGS. 10A and 10B, the first material layers 31 may be removed to form the recessed regions RC. After an interlayer insulating layer 34 is formed over the first and second material layers 31 and 32, at least one first slit SL1 may be formed through the interlayer insulating layer 34, the first material layers 31, and the second material layers 32, so that separate stacked structures ST may be formed. Subsequently, the first material layers 31 exposed through the first slit SL1 may be etched from side walls of the stacked structure ST exposed through the first slit SL1 and thus removed. Therefore, the first material layers 31 may be removed from the side regions of each stacked structure ST, while the first material layers 31 may remain in the central region of the stacked structure ST.

Figure 11A:
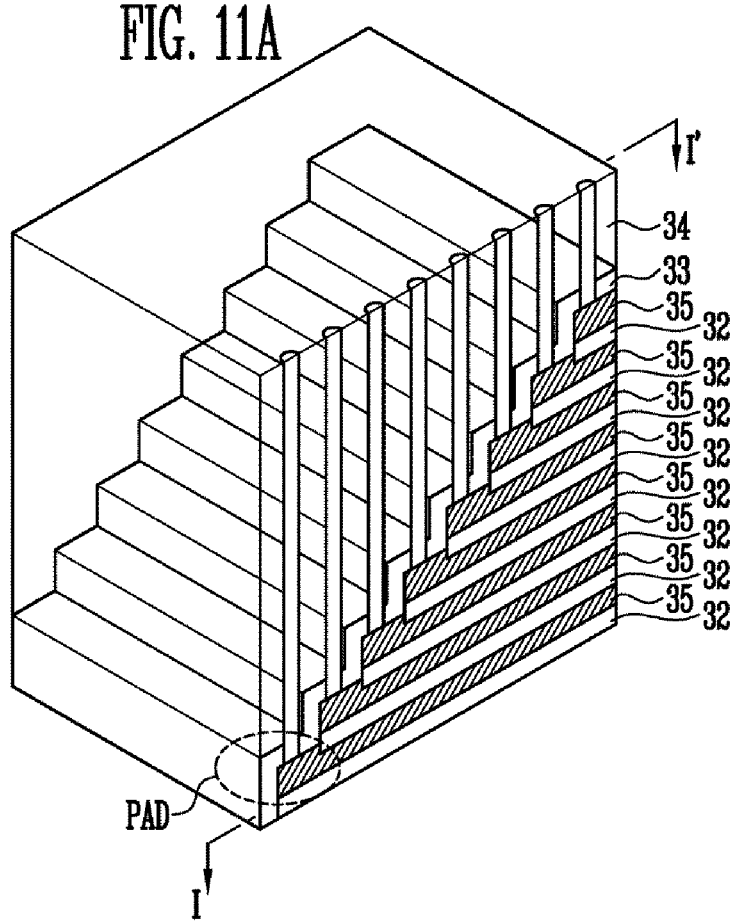
Figure 11B:
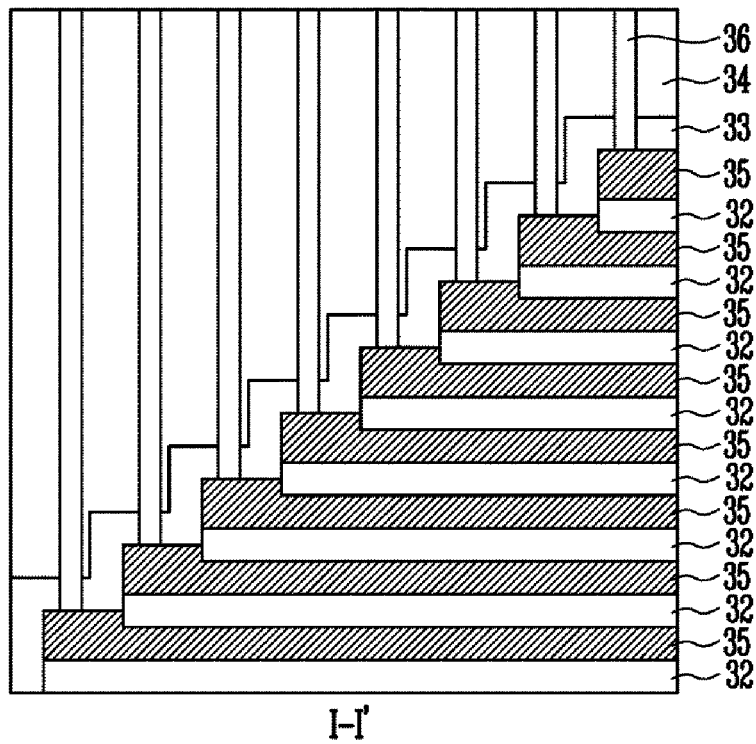

As illustrated in FIGS. 11A and 11B, the thickness of the ends of the recessed regions RC may be increased. For example, the buffer layer 33 through the recessed regions RC may be selectively etched. An etch process may be performed under the condition that the buffer layer 33 is etched at a higher rate than the second material layers 32. As a result, the ends of the recessed regions RC may be selectively extended.

Subsequently, conductive layers 35 may be formed in the recessed regions RC. As a result, the pad portions PAD exposed at the end of the stacked structure ST may have a greater thickness than other portions of the conductive layers 35.

Subsequently, contact holes may be formed through the interlayer insulating layer 34 so that the pad portions PAD may be exposed through the contact holes, and conductive layers may be formed in the contact holes. As a result, each of the contact plugs 36 may be coupled to each of the pad portions PAD.

FIGS. 12A to 12D are perspective views illustrating a cell structure of a semiconductor device according to an embodiment of the present invention. However, for illustration purposes, an insulating layer is not depicted.

Figure 12A:
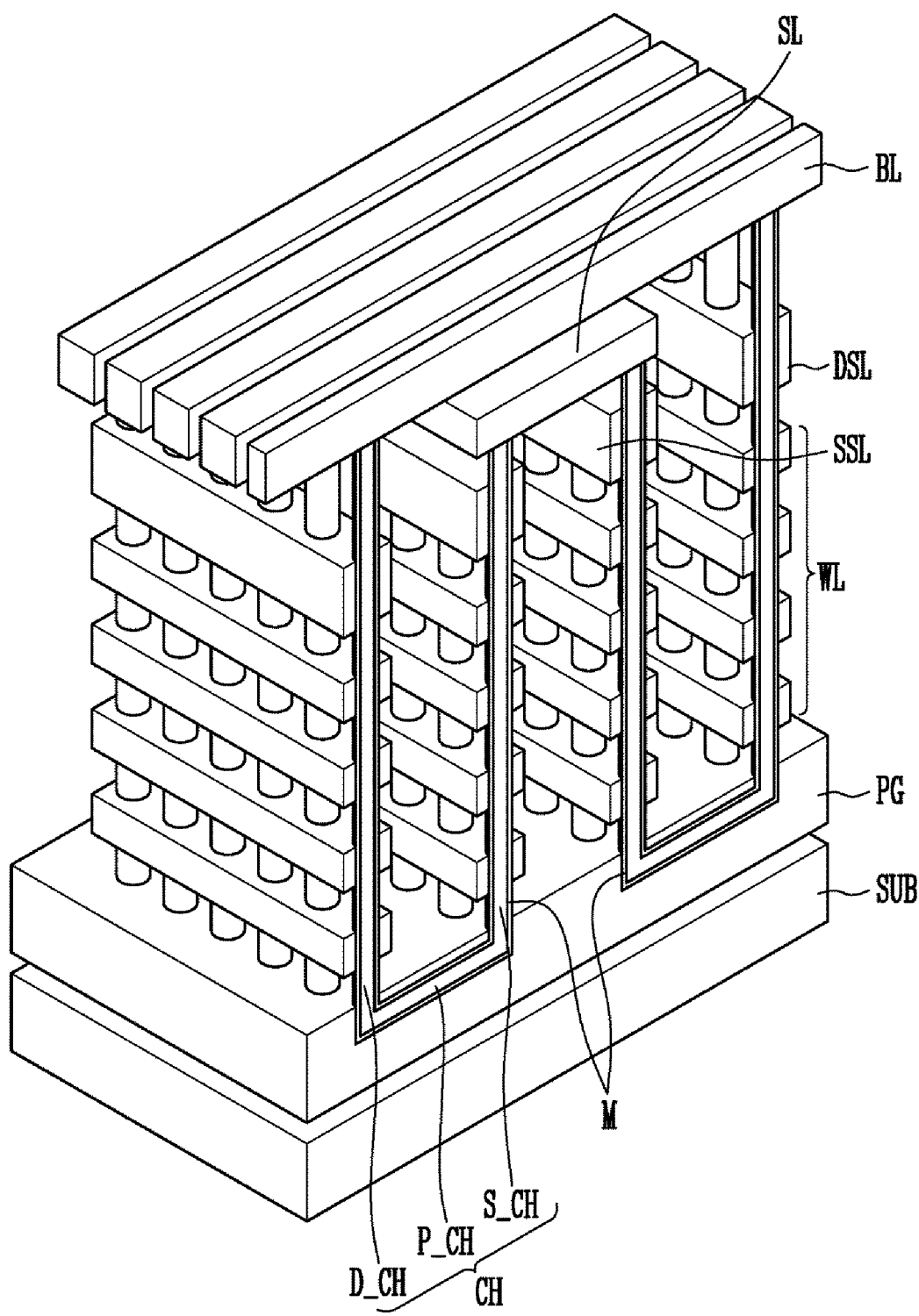
FIGS. 12A to 12D are perspective views illustrating a cell structure of a semiconductor device according to an embodiment of the present invention.

FIG. 12A illustrates an example in which a channel layer is formed in a U-shape manner.

As illustrated in FIG. 12A, a semiconductor device may include a pipe gate PG, word lines WL, at least one drain selection line DSL, and at least one source selection line SSL that are stacked on a substrate SUB.

The semiconductor device may further include a plurality of U-shaped channel layers CH. The channel layers CH may include a pipe channel layer P_CH that is formed in the pipe gate PG and source and drain side channel layers S_CH and D_CH that are connected to the pipe channel layer P_CH.

The source side channel layers S_CH may pass through the word lines WL and the source selection line SSL, and the drain side channel layers D_CH may pass through the word lines WL and the drain selection line DSL. In addition, the source side channel layers S_CH may be coupled to a source line SL, and the drain side channel layers D_CH may be coupled to bit lines BL.

The semiconductor device may further include memory layers M that are interposed between the channel layers CH and the word lines WL.

According to the above-described structure of the semiconductor device, a source selection transistor may be formed at an interconnection between the source side channel layer S_CH and the source selection line SSL. A source side memory cell may be formed at an interconnection between the source side channel layer S_CH and the word line WL. A pipe transistor may be formed at an interconnection between the pipe channel layer P_CH and the pipe gate PG. A drain selection transistor may be formed at an interconnection between the drain side channel layer D_CH and the drain selection line DSL. A drain side memory cell may be formed at an interconnection between the drain side channel layer D_CH and the word line WL. Therefore, at least one source selection transistor, a plurality of source side memory cells, a pipe transistor, a plurality of drain side memory cells, and at least one drain selection transistor that are coupled in series with each other may form a single string. Strings may be arranged in a U-shaped manner.

Figure 12B:
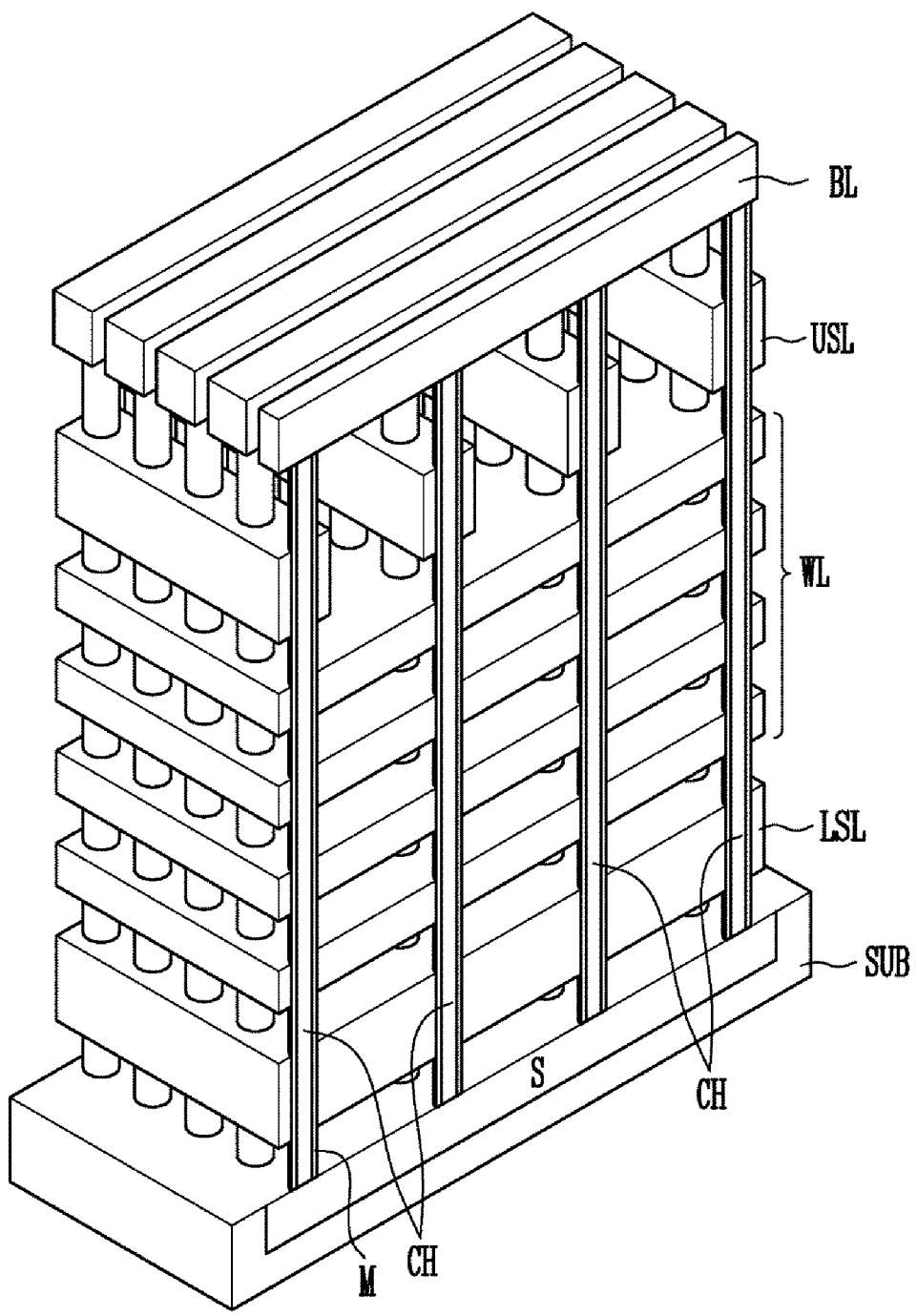

FIG. 12B illustrates an example in which a channel layer is formed in a vertical shape manner.

As illustrated in FIG. 12B, the semiconductor device may include at least one lower selection line LSL, the word lines WL, and at least one upper selection line USL that are subsequently stacked on the substrate SUB where a source region S is formed. The word lines WL may be formed in the shape of a plate, and at least any one of the upper or lower selection lines USL and LSL may have a linear shape.

The semiconductor device may further include the channel layers CH. The channel layers CH may protrude from the substrate SUB and pass through the lower selection line LSL, the word lines WL, and the upper selection lines USL. Top portions of the channel layers CH may be coupled to the bit lines BL, and bottom portions of the channel layers CH may be coupled to the source region S.

The semiconductor device may further include the memory layers M that are interposed between the channel layers CH and the word lines WL.

According to the above-described structure of the semiconductor device, a lower selection transistor may be formed at an intersection between the channel layer CH and the lower selection line LSL. A memory cell may be formed at an intersection between the channel layer CH and the word line WL. An upper selection transistor may be formed at an intersection between the channel layer CH and the upper selection line USL. Therefore, at least one lower selection transistor, a plurality of memory cells, and at least one upper selection transistor that are coupled in series with each other may form a single string. Strings may be arranged in a vertical manner.

Figure 12C:
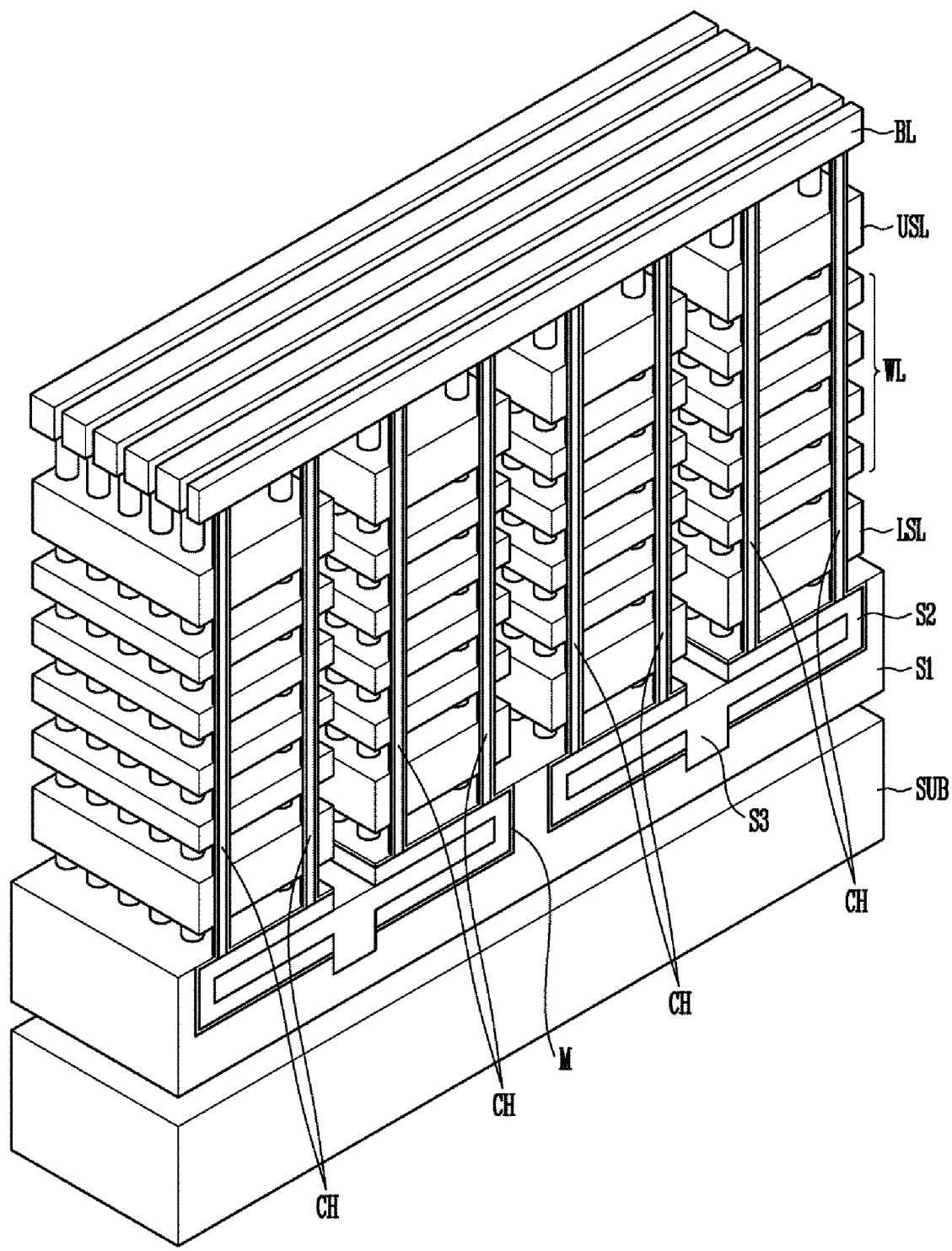

FIG. 12C illustrates an example in which strings are arranged in a vertical manner.

As illustrated in FIG. 12C, the semiconductor device may include source layers S1 to S3, at least one lower selection line LSL, word lines WL, and at least one upper selection line USL that are sequentially stacked.

The source layers S1 to S3 may include a first source layer S1, a second source layer S2, and a third source layer S3. The first source layer S1 may be formed on the substrate SUB. The third source layer S3 may be formed in the first source layer S1. The second source layer S2 may surround the third source layer S3 and be interposed between the first source layer S1 and the third source layer S3. In addition, the third source layer S3 may be formed through the second source layer S2 and coupled to the first source layer S1. Each of the first and second source layers S1 and S2 may include a polysilicon layer, and the third source layer S3 may include a metal layer such as a tungsten (W) layer.

The semiconductor device may further include the channel layers CH. The channel layers CH may protrude from a top surface of the second source layer S2 and be formed through the lower selection line LSL, the word lines WL, and the upper selection lines USL. The channel layers CH may be connected to the second source layer S2 in a single-body structure. In addition, top portions of the channel layers CH may be coupled to the bit lines BL.

The semiconductor device may further include the memory layers M that are interposed between the channel layers CH and the word lines WL. The memory layer M may surround outer surfaces of the channel layers CH and the second source layer S2.

According to the structure of the above structure, at least one lower selection transistor, memory cells, and at least one upper selection transistor that are coupled in series with each other may form a single string. Strings may be arranged in a vertical manner.

Figure 12D:
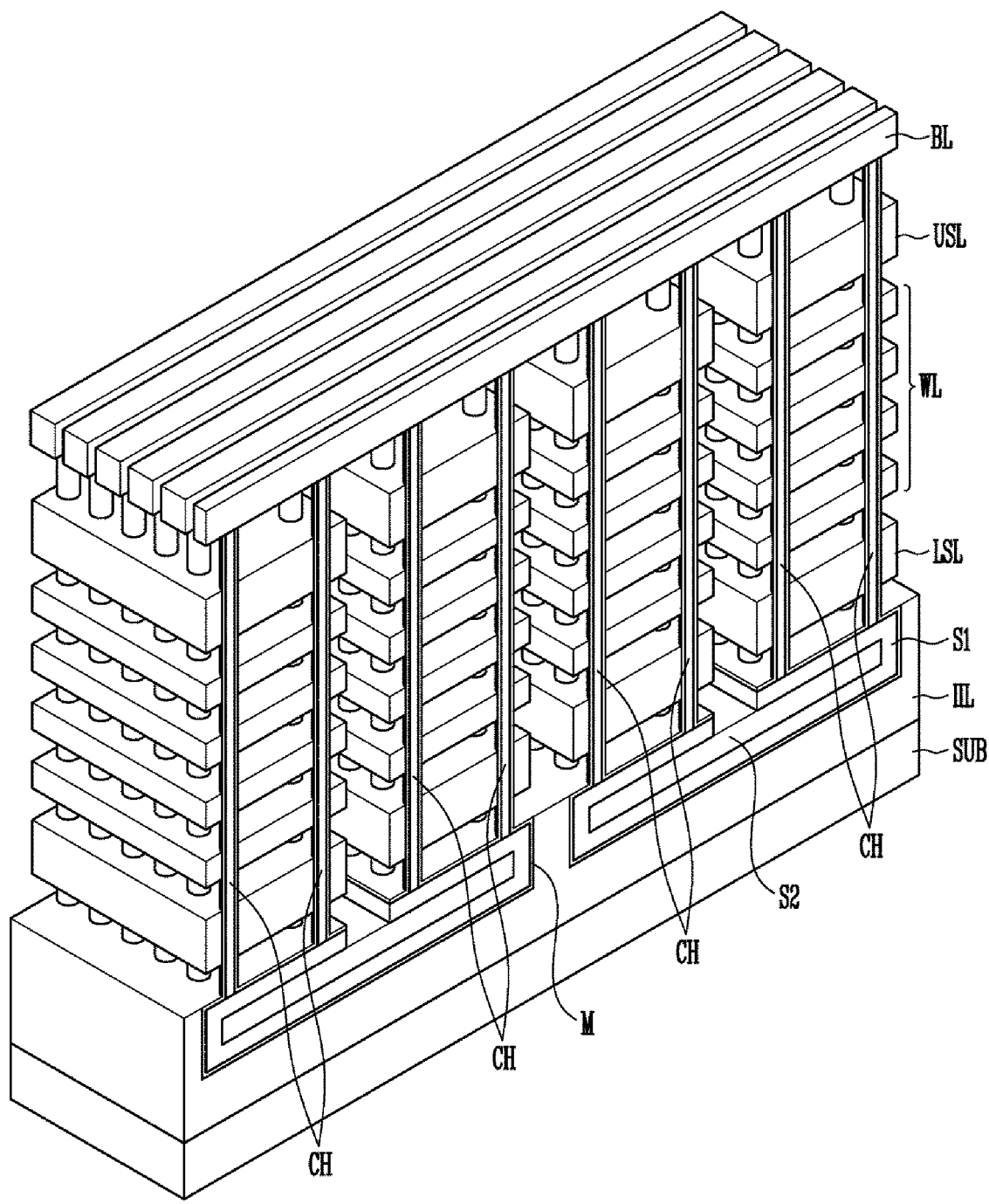

FIG. 12D illustrates an example in which a channel layer has a vertical shape.

As illustrated in FIG. 12D, the semiconductor device may include an interlayer insulating layer IIL, at least one lower selection line LSL, word lines WL, and at least one upper selection line USL that are sequentially stacked. The semiconductor device may further include the first source layer S1 and the second source layer S2. The first source layer S1 may be formed in the interlayer insulating layer IIL, and the second source layer S2 may be formed in the first source layer S1.

The semiconductor device may further include the channel layers CH that protrude from the first source layer S1 and pass through the lower selection line LSL, the word lines WL, and the upper selection lines USL. The channel layers CH may be connected to the first source layer S1 in a single-body structure. In addition, top portions of the channel layers CH may be coupled to the bit lines BL.

The semiconductor device may further include the memory layers M that are interposed between the channel layers CH and the word lines WL. The memory layers M may surround outer surfaces of the channel layers CH and the first source layer S1.

FIG. 12D illustrates the first source layer S1 that completely surrounds a bottom surface of the second source layer S2. However, part of the bottom surface of the second source layer S2 may protrude and pass through the first source layer S1.

According to the above-described structure of the semiconductor device, at least one lower selection transistor, a plurality of memory cells, and at least one upper selection transistor that are coupled in series with each other may form a single string. Strings may be arranged in a vertical manner.

The semiconductor devices described with reference to FIGS. 12A to 12D may be manufactured by applying the above-described manufacturing methods. A detailed description of the manufacturing methods is omitted.

Figure 13:
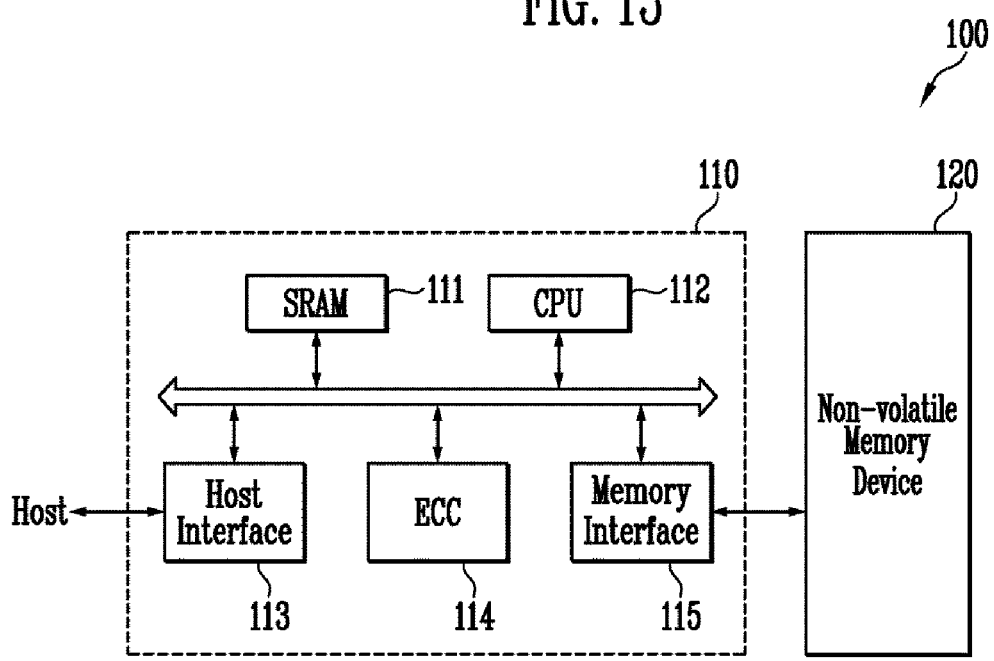
FIG. 13 is a block diagram illustrating the configuration of a memory system according to an embodiment of the present invention.

As illustrated in FIG. 13, a memory system 100 according to an embodiment of the present invention may include a non-volatile memory device 120 and a memory controller 110.

The non-volatile memory device 120 may have any of the above-described structures. In addition, the non-volatile memory device 120 may be a multi-chip package composed of a plurality of flash memory chips.

The memory controller 110 may be configured to control the non-volatile memory device 120. The memory controller 110 may include SRAM 111, a CPU 112, a host interface 113, an ECC 114, and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include ROM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with an external device (e.g., a host) through one of the interface protocols including USB, MMC, PCI-E, SATA, PATA, SCSI, ESDI, and IDE.

Figure 14:
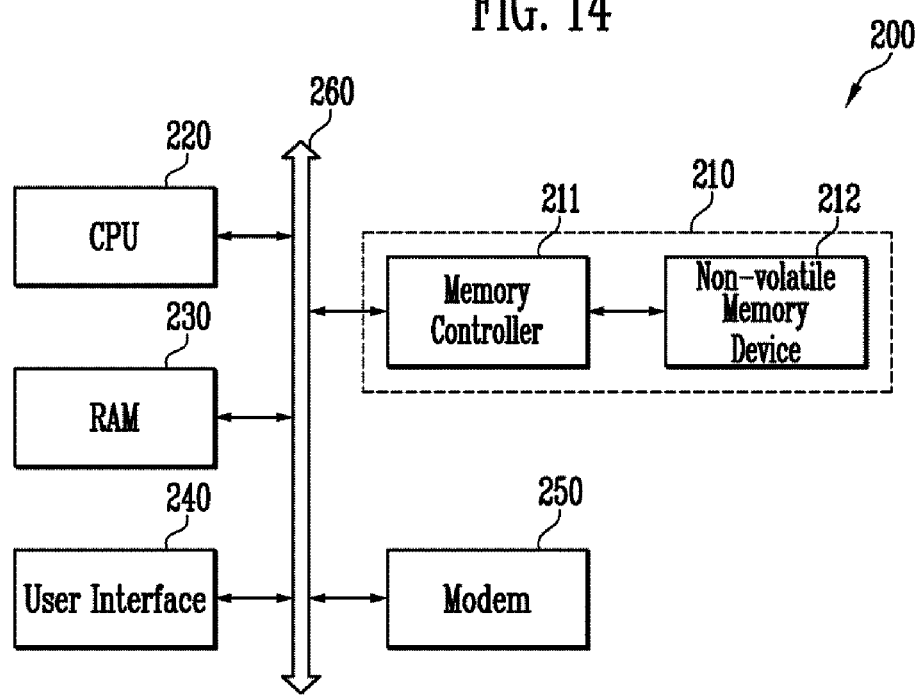
FIG. 14 is a block diagram illustrating the configuration of a computing system according to an embodiment of the present invention.

As illustrated in FIG. 14, a computing system 200 according to an embodiment of the present invention may include a CPU 220, RAM 230, a user interface 240, a modem 250, and a memory system 210 that are electrically coupled to a system bus 260. In addition, when the computing system 200 is a mobile device, a battery may be further included to apply an operating voltage to the computing system 200. The computing system 200 may further include application chipsets, a CMOS Image Sensor (CIS), and mobile DRAM.

As described above with reference to FIG. 13, the memory system 210 may include a non-volatile memory device 212 and a memory controller 211.

By selectively increasing the thickness of pad portions of conductive layers, an etch margin may be ensured during a contact hole forming process for forming a contact plug. Therefore, a punch phenomenon and a not-open phenomenon may be prevented during the contact hole forming process.

What is claimed is:

1. A method of manufacturing a semiconductor device, the method comprising:
    forming a stacked structure including a plurality of first material layers and a plurality of second material layers formed alternately with each other, wherein an end of the stacked structure is patterned stepwise;
    forming a plurality of recessed regions by removing the plurality of first material layers;
    increasing thicknesses of ends of the plurality of recessed regions; and
    forming a plurality of conductive layers in the plurality of recessed regions in which the ends are extended.

2. The method of claim 1, further comprising forming impurity regions in the plurality of second material layers by implanting impurities into the stacked structure having a stepped end.

3. The method of claim 2, wherein the forming of the impurity regions is performed by using an ion implantation process, and a projected ion range (Rp) of the ion implantation process is located in the plurality of second material layers.

4. The method of claim 2, wherein the increasing of the thicknesses of the ends of the plurality of recessed regions comprises etching the impurity regions exposed through the plurality of recessed regions.

5. The method of claim 2, further comprising forming a barrier layer on an entire surface of the stacked structure before the forming of the impurity regions.

6. The method of claim 2, further comprising forming a plurality of barrier layers by oxidizing the first material layers exposed at the end of the stacked structure by a predetermined thickness before the forming of the impurity regions.

7. The method of claim 1, further comprising forming a buffer layer on the stacked structure before the forming of the plurality of recessed regions.

8. The method of claim 7, wherein the increasing of the thicknesses of the ends of the plurality of recessed regions comprises etching the buffer layer exposed at the ends of the plurality of recessed regions by a predetermined thickness.

* * * * *